US008922285B2

(12) United States Patent
Houssameddine et al.

(10) Patent No.: US 8,922,285 B2
(45) Date of Patent: Dec. 30, 2014

(54) MAGNETORESISTIVE RADIOFREQUENCY OSCILLATOR AND METHOD FOR GENERATING AN OSCILLATING SIGNAL

(75) Inventors: Dimitri Houssameddine, Gilbert, AZ (US); Bertrand Delaet, Bernin (FR); Marie-Claire Cyrille, Sinard (FR); Ursula Ebels, Grenoble (FR); Michael Quinsat, Grenoble (FR)

(73) Assignees: Commissariat à l'énergie atomique et aux énergies alternatives, Paris (FR); Centre National de la Recherche Scientifique, Paris (FR)

( * ) Notice: Subject to any disclaimer, the term of this patent is extended or adjusted under 35 U.S.C. 154(b) by 66 days.

(21) Appl. No.: 13/582,291

(22) PCT Filed: Mar. 1, 2011

(86) PCT No.: PCT/EP2011/053023
§ 371 (c)(1),
(2), (4) Date: Nov. 13, 2012

(87) PCT Pub. No.: WO2011/107473
PCT Pub. Date: Sep. 9, 2011

(65) Prior Publication Data
US 2013/0057356 A1    Mar. 7, 2013

(30) Foreign Application Priority Data
Mar. 3, 2010  (FR) .................... 10 51548

(51) Int. Cl.
*H03B 15/00* (2006.01)
*H03L 5/00* (2006.01)
*H03L 7/26* (2006.01)

(52) U.S. Cl.
CPC ............. *H04B 15/006* (2013.01); *H03L 5/00* (2013.01); *H03L 7/26* (2013.01)
USPC ............ 331/96; 331/3; 331/94.1; 331/177 R; 331/183

(58) Field of Classification Search
CPC .. G11B 5/3903; G11B 5/3906; G11B 5/3909; H03B 5/40; H03B 15/00; H03B 15/006; H03L 5/00; H03L 5/02; H03L 7/26

USPC ............. 257/295, 421, 422; 331/3, 94.1, 96, 331/157, 177 R, 182, 183, 187; 360/324
See application file for complete search history.

(56) References Cited

U.S. PATENT DOCUMENTS

| 5,695,864 A | 12/1997 | Slonczewski |
| 6,566,872 B1 | 5/2003 | Sugitani |

(Continued)

FOREIGN PATENT DOCUMENTS

| FR | 2817998 | 6/2002 |
| FR | 2892871 | 5/2007 |
| WO | 2008/101545 A1 | 8/2008 |

OTHER PUBLICATIONS

Georges et al. "*Impact of the electrical connection of N Spin Transfer Oscillators on their synchronization: an analytical study*", Unité Mixte de Physique CNRS/Thales, Orsay France, pp. 1-12 (2008).

(Continued)

*Primary Examiner* — Levi Gannon
(74) *Attorney, Agent, or Firm* — Occhiuti & Rohlicek LLP

(57) ABSTRACT

The invention relates to a radiofrequency oscillator which incorporates: a spin-polarized electric current magnetoresistive device (6), a terminal (18) for controlling the frequency or amplitude of the oscillating signal, a servo loop (34) connected between the output terminal and the control terminal for applying a control signal to the control terminal in order to slave a characteristic of the oscillating signal to a reference value, the servo loop (34) comprising: a sensor (36) of the amplitude of the oscillating signal oscillations, and a comparator (38) capable of generating the control signal according to the measured amplitude and the reference value.

8 Claims, 2 Drawing Sheets

(56) References Cited

U.S. PATENT DOCUMENTS

| | | | |
|---|---|---|---|
| 7,504,898 B2* | 3/2009 | Fukuzawa et al. | 331/96 |
| 7,589,600 B2* | 9/2009 | Dimitrov et al. | 331/94.1 |
| 7,633,699 B2* | 12/2009 | Kaka et al. | 360/67 |
| 7,978,017 B2* | 7/2011 | Pernia et al. | 331/167 |
| 8,194,361 B2* | 6/2012 | Kudo et al. | 360/324.11 |
| 2007/0285184 A1* | 12/2007 | Eyckmans et al. | 331/107 R |
| 2009/0115541 A1* | 5/2009 | Persson et al. | 331/135 |
| 2010/0039181 A1* | 2/2010 | Firastrau et al. | 331/94.1 |

OTHER PUBLICATIONS

Georges et al. "*Coupling efficiency for phase locking of a spin transfer oscillator to a microwave current*", Unité Mixte de Physique CNRS/Thales and Uniyersité Paris, pp. 1-14 (2008).

Baibich, M., Broto, J.M., Fert, A., Nguyen Van Dau, F., Petroff, F., Etienne, P., Creuzet, G., Friederch, A. and Chazelas, J., "*Giant magnetoresistance of (001)Fe/(001)Cr magnetic superlattices*", Phys.Rev.Lett., 61 (1988) 2472.

Moodera, JS., Kinder, LR., Wong, TM. and Meservey,R.. "*Large magnetoresistance at room temperature in ferromagnetic thin-film tunnel junctions*", Phys.Rev.Lett 74 , (1995) 3273-6).

Katine, J.A., Albert, F.J., Buhrman, R.A., Myers, E.B., and Ralph, D.C., "*Current-Driven Magnetization Reversal and Spin-Wave Excitations in Co /Cu /Co Pillars*", Phys.Rev.Lett. 84, 3149 (2000).

Kiselev, S.I., Sankey, J.C., Krivorotov, LN., Finley, N.C., Schoelkopf, R.J., Buhrman, R.A., and Ralph, D.C., "*Microwave oscillations of a nanomagnet driven by a spin-polarized current*", Nature, 425, 380 (2003).

\* cited by examiner

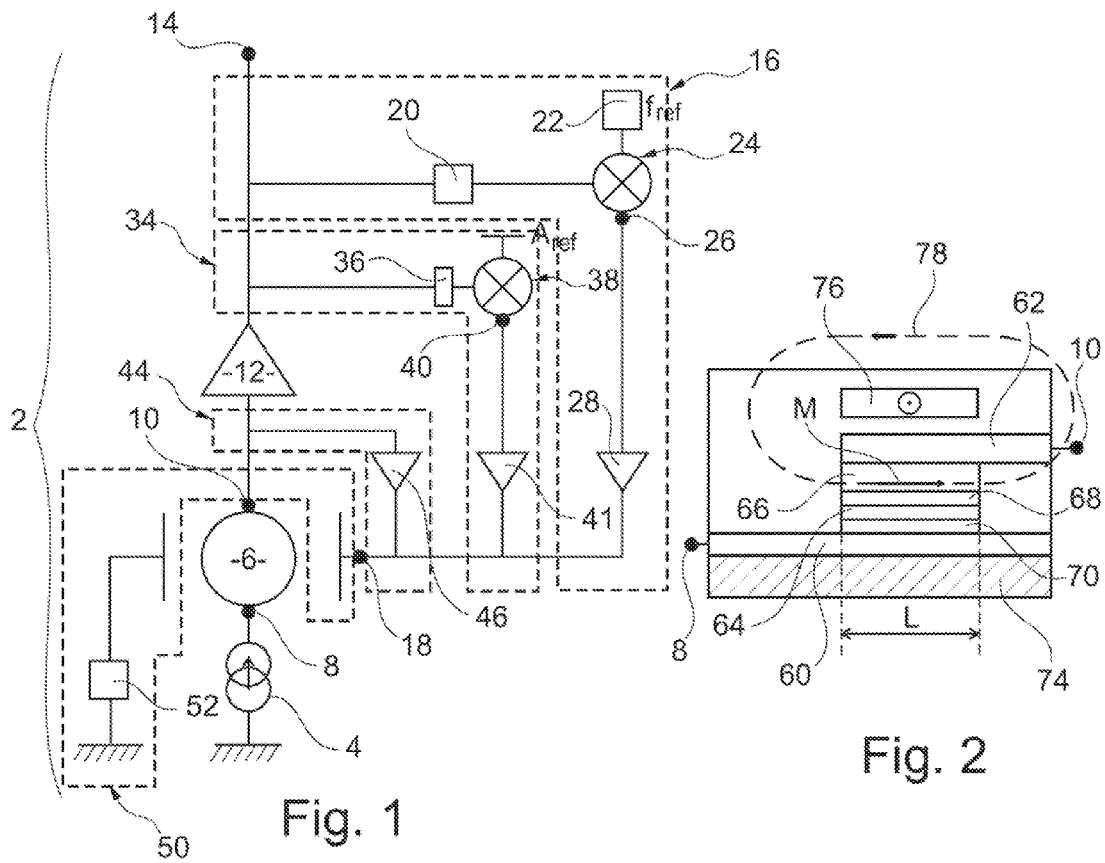
Fig. 1
Fig. 2
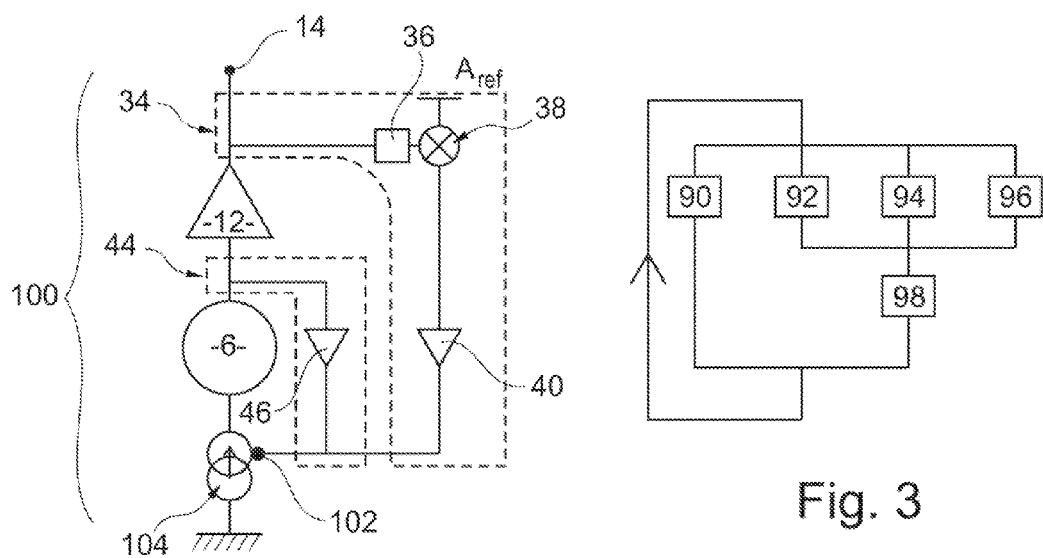
Fig. 4
Fig. 3

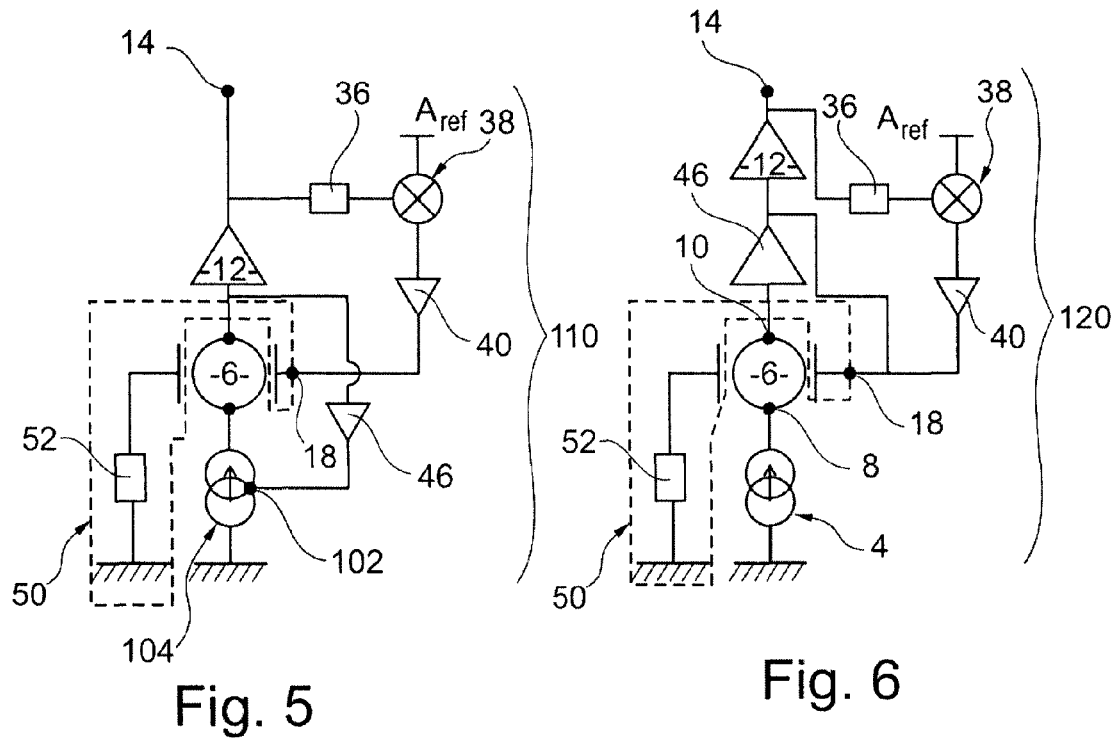
Fig. 5
Fig. 6
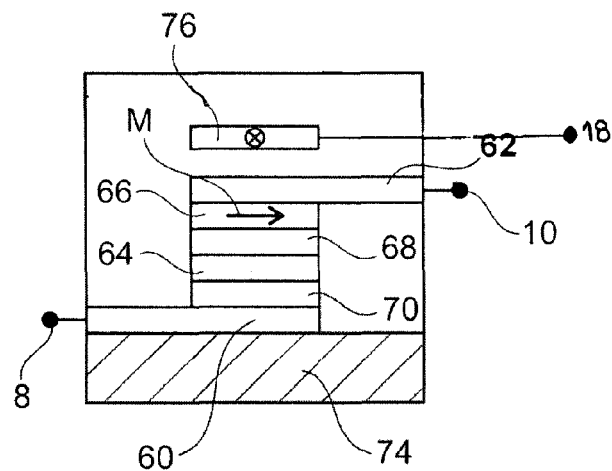
Fig. 7

MAGNETORESISTIVE RADIOFREQUENCY OSCILLATOR AND METHOD FOR GENERATING AN OSCILLATING SIGNAL

CROSS-REFERENCE TO RELATED APPLICATIONS

This application is the National Stage of International Application No. PCT/EP2011/053023, filed on Mar. 1, 2011, which claims the benefit of the priority date of French Application No. 1051548, filed on Mar. 3, 2010. The content of these applications is hereby incorporated by reference in its entirety.

FIELD OF DISCLOSURE

The invention pertains to a radiofrequency oscillator and to a method for generating an oscillating signal with this radiofrequency oscillator.

BACKGROUND

Radiofrequency oscillators integrate a magnetoresistive device within which a spin-polarized electrical current flows. In such an oscillator, the passage of the current prompts a periodic variation in the resistance of the magnetoresistive device. A high-frequency signal, i.e. a signal whose frequency typically ranges from 100 MHz to some tens of GHz, is built from this periodic variation. The period of the variations of the resistivity, and therefore the oscillation frequency, can be adjusted by playing on the intensity of the current that crosses the magnetoresistive device and/or an external magnetic field.

Such oscillators are intended for example for use in radio telecommunications because they can generate a wide range of frequencies with a high qualify factor.

The term "quality factor" designates the following ratio:

$$Q = f_{osc}/\Delta f$$

Where:
Q is the quality factor,
$f_{osc}$ is the oscillation frequency of the oscillator, and
$\Delta f$ is the width at mid-height of the line centered on the frequency $f_{osc}$ in the power spectrum of this oscillator.

Certain radiofrequency oscillators are derived from spin electronics.

Spin electronics uses the spin of the electrons as an additional degree of freedom in order to generate novel effects. The spin polarization of an electrical current results from the asymmetry existing between the diffusion of the spin-up type conduction electrons (i.e. electrons parallel to the local magnetization) and spin-down type conduction electrons (i.e. electrons anti-parallel to the local magnetization). This asymmetry leads to an asymmetry in the conductivity between the two spin-up and spin-down channels, whence a sharp spin polarization of the electrical current.

This spin polarization of the current is the source of magnetoresistive phenomena in magnetic multi-layers such as giant magnetoresistance (Baibich, M., Broto, J. M., Pert, A., Nguyen Van Dau, F., Petroff, F., Etienne, P., Creuzet, G., Friederch, A. and Chazelas, J., "*Giant magnetoresistance of (001)Fe/(01)Cr magnetic superlattices*", Phys. Rev. Lett., 61 (1988) 2472), or tunnel magnetoresistance (Moodera, J S., Kinder, L R., Wong, T M. and Meservey, R. "*Large magnetoresistance at room temperature in ferromagnetic thin-film tunnel junctions*", Phys. Rev. Lett 74, (1995) 3273-6).

Besides, it has also been observed that passing a spin-polarized current through a thin magnetic layer can induce a reversal of its magnetization when there is no external magnetic field (Katine, J. A., Albert, F. J., Buhrman, R. A, Myers, E. B., and Ralph, D. C., "*Current-Driven Magnetization Reversal and Spin-Wave Excitations in Co/Cu/Co Pillars*", Phys. Rev. Lett. 84, 3149 (2000).

Polarized current can also generate sustained magnetic excitations, also known as oscillations (Kiselev, S. I., Sankey, J. C., Krivorotov, L N. Emley, N. C., Schoelkopf, R. J., Buhrman, R. A., and Ralph, D. C., "*Microwave oscillations of a nanomagnet driven by a spin-polarized current*", Nature, 425, 380 (2003)). By using the effect of the generation of sustained magnetic excitations on a magnetoresistive device it is possible to convert this effect into a modulation of electrical resistance that is directly usable in electronic circuits and that can therefore, as a corollary, act directly at the frequency level. The U.S. Pat. No. 5,895,884 describes various developments implementing the physical principle mentioned here above. It describes especially the precession of the magnetization of a magnetic layer through which a spin-polarized electrical current flows. The physical principles implemented as well as the terminology used are also described and defined in the patent application number FR 2 892 871.

The oscillation frequency of these radiofrequency oscillators is adjusted by playing on the Intensity of the current that crosses it and, if necessary, also on an external magnetic field.

Prior-art radiofrequency oscillators comprise:
  a magnetoresistive device within which there flows a spin-polarized electrical current to generate an oscillating signal oscillating at an oscillation frequency on a output terminal, the device comprising a stack of at least:
    a first magnetic layer, called a "reference layer", capable of spin-polarizing the electrical current, and having a magnetization of fixed direction,
    a second magnetic layer, called a "free layer", the magnetization of which can oscillate when it is crossed by the spin-polarized current, and
    a non-magnetic layer, called a "spacer" interposed between the two previous layers to form a tunnel junction or a spin valve,
  a current source to make a current of electrons flow in said layers perpendicularly to them,
  a control terminal to control the frequency or amplitude of the oscillating signal,
  an automatic control loop connected between the output terminal and the control terminal to apply a control signal to the control terminal in order to automatically lock a characteristic of the oscillating signal into a reference value.

The spacer forms a tunnel Junction when it is designed to create the phenomenon of tunnel magnetoresistance. As a variant, the spacer forms a spin valve when it is designed to create the phenomenon of giant magnetoresistance.

The present applicant knows oscillators in which the automatic control loop is a frequency-locked loop. Certain frequency-locked loops are also known as phase-locked loops or PLLs, Such a loop comprises a frequency divider for the generation, from the oscillating signal, of an oscillating signal of reduced frequency which is compared with the signal of a reference clock. The control signal is generated from the difference between the reduced frequency and the frequency of the signal of the reference clock. The control signal is built so as to modify the frequency of the generated oscillating signal in a sense that reduces this difference.

The control signal is then injected into a control terminal for controlling the frequency of the oscillating signal in intensity. Typically, this intensity control terminal is that of a current summing element which enables the control signal to be added to the constant direct current generated by the current source.

Prior-art oscillators work well but several improvements are desirable. For example, it is desirable to improve the quality factor of these radiofrequency oscillators. If is also desirable to reduce their consumption of electricity.

The invention seeks to improve prior-art radiofrequency oscillators on at least one of these points.

SUMMARY

An object of the invention therefore is a radiofrequency oscillator in which the automatic control loop comprises:
a sensor of the amplitude of the oscillations of the oscillating signal, and
a comparator capable of generating the control signal as a function of the amplitude measured and the reference value.

This oscillator makes use of the fact that the amplitude of the oscillations varies as a function of the frequency of the oscillations in non-linear magnetoresistive devices. Thus, knowledge of the amplitude of oscillations is sufficient to deduce the oscillation frequency of the magnetoresistive device therefrom. Now, the amplitude of the oscillations can be measured far more swiftly than the frequency of the oscillations. Thus, measuring the amplitude of the oscillations rather than the frequency reduces the reaction time of the automatic control loop. This also improves the quality factor.

The embodiments of this oscillator may comprise one or more of the following characteristics:
the comparator is capable of directly comparing the measured amplitude with a reference amplitude value so as to automatically control the amplitude of the oscillating signal;
the oscillator comprises a generator of a magnetic field, the field lines of which pass through the free layer, this generator being equipped with a control terminal for controlling at least one characteristic of the generated magnetic field capable of modifying the oscillation frequency or the amplitude of the oscillating signal, this control terminal constituting the control terminal of the frequency or amplitude of the oscillating signal;
the derivative $df_{osc}/dA$ of the magnetoresistive device is greater than 10 MHz/Ω, and preferably greater than 100 MHz/Ω, on the range of operation of the oscillator, where $f_{osc}$ is the oscillation frequency of the oscillating signal generated at the output terminal and A is the amplitude of the variations of the resistance of the magnetoresistive device expressed in Ohms;
the oscillator furthermore comprises a feedback loop connected between the output terminal and the control terminal, this feedback loop comprising an amplifier capable of generating, as a control signal, an amplified oscillating signal in phase with the oscillating signal generated by the output terminal.

These embodiments of the oscillator furthermore have the following advantages:
directly comparing the amplitude of the oscillations with a reference amplitude value making it possible to obtain information on the divergence between the oscillation frequency of the magnetoresistive device and a reference frequency without precise knowledge of the relationship linking the amplitude of the oscillations with the frequency of these oscillations;

using a magnetic field generator to adjust the frequency and amplitude of the oscillating signal limits the electrical consumption of the oscillator;
using a magnetoresistive device whose derivative $df_{osc}/dA$ is greater than 10 MHz/Ω gives a faster automatic control loop while maintaining the stability of the oscillator; and
using a feedback loop increases the quality factor.

An object of the invention is also a method for generating an oscillating signal at an oscillation frequency, this method comprising:
the providing of the above radiofrequency oscillator;
the measuring of the amplitude of the oscillations of the oscillating signal; and
the generating of the control signal as a function of the amplitude measured and the reference value.

The invention will be understood more clearly from the following description, given purely by way of a non-exhaustive example and made with reference to the appended drawings, of which:

BRIEF DESCRIPTION OF THE FIGURES

FIG. 1 is a schematic illustration of the architecture of a radiofrequency oscillator;

FIG. 2 is a schematic illustration in vertical section of a magnetoresistive device used in the oscillator of FIG. 1;

FIG. 3 is a flowchart of a method for generating an oscillating signal by means of the oscillator of FIG. 1;

FIGS. 4, 5 and 6 are schematic illustrations of alternative embodiments of a radiofrequency oscillator; and FIG. 7 is a schematic illustration of the architecture of another magnetoresistive device that can be used in the oscillator of FIG. 1.

In these figures, the same references are used to designate the same elements.

Here below in this description, the characteristics and functions well-known to those skilled in the art are not described in detail.

DETAILED DESCRIPTION

FIG. 1 shows a general architecture of a radiofrequency oscillator 2. This oscillator 2 comprises:
a source 4 of direct current $I_d$,
a magnetoresistive device 6 equipped with an input terminal 8 connected to the current source 4 and to an output terminal 10 of the oscillating signal generated by this device 6, and
a low-noise amplifier 12, the input of which is connected to the output 10 and the output of which is connected to the output terminal 14 of the oscillating signal generated by the oscillator 2.

The device 6 is formed by a stack of magnetic and non-magnetic layers forming a tunnel junction also known as a TMR (tunnel magnetoresistance) junction. This stack comprises at least:
a magnetic layer, called a "reference layer", capable of spin-polarizing the electrical current generated by the source 4, and having a magnetization of fixed direction,
a magnetic layer, called a "free layer", the magnetization of which can oscillate when it is crossed by the spin-polarized current, and
a non-magnetic layer, called a "spacer", interposed between the two previous layers to create the tunnel junction.

The device 6 works as a spin transfer oscillator or STO when the intensity of the spin-polarized current crosses a threshold $I_c$ known as the "critical current of oscillation".

When the intensity of the spin-polarized current crosses this threshold $I_c$, the magnetization of the free layer of the device 6 processes sustainedly. Typically, the threshold $I_c$ corresponds to a current density greater than $10^7$ A/cm$^2$ in the cross-section of the layers of the stack. If not, the device 6 behaves like a resonator, also known as an STR (spin-transfer resonator), and the oscillating signal generated is dampened and not sustained. However, even in this case, to generate the dampened oscillating signal, the current density in the cross-section of the layers of the stack must be high. Typically, the term "high density of current" designates current density greater than $10^6$ A/cm$^2$.

To obtain high current density, the cross-section of at least one of the layers of the stack typically has a diameter of less than 300 nm and preferably less than 200 or 100 nm. When the cross-section is not a disk, the term "diameter" must be understood to mean "hydraulic diameter".

The source 4 generates a direct current $I_d$ the intensity of which, in this embodiment is below the threshold $I_c$ but sufficiently high to give rise to a high current density in the stack of layers. Thus, here below in this description, the device 6 works as a resonator and not as a spin-transfer oscillator.

The oscillator 2 has different automatic control and feedback loops. To simplify the description, these are all shown in the same embodiment in FIG. 1. However, in practice, these loops to be implemented are chosen as a function of the characteristics of the device 6.

In FIG. 1, the oscillator 2 comprises a frequency-locked loop 16 for the automatic control of the oscillating signal generated by the device 6. This loop 16 is also known as a phase-locked loop or PLL. This loop 16 is directly connected between the terminal 14 and a terminal 18 for controlling the frequency and amplitude of the oscillating signal s(t) generated by the device 6. This loop 16 comprises a frequency divider 20 capable of generating, from the oscillating signal s(t), an oscillating signal s(t)* with a lower frequency $f_{osc}$. For example, the divider 20 divides the frequency $f_{osc}$ of the signal s(t) by at least 100. Here, the frequency $f_{osc}$ is from 1 to 100 MHz.

The loop 16 also has a reference clock 22 which generates a clock signal r(t) that is far more stable than the oscillating signal s(t) at a frequency $f_{ref}$ far below the frequency $f_{osc}$. The frequency $f_{ref}$ is typically greater than 1 MHz and is, for example, from 1 to 100 MHz.

The divider 20 and the clock 22 are connected to respective inputs of a comparator 24. This comparator 24 generates a signal $C_1(t)$ for controlling the frequency $f_{osc}$ at an output 26. This signal $C_1(t)$ is built so as to reduce the divergence between the frequencies $f_{osc-r}$ and $f_{ref}$.

The loop 16 also comprises an amplifier 28 capable of amplifying the signal $C_1(t)$ before injecting it into the control terminal 18.

The oscillator 2 also has an amplitude-locked loop 34 for locking the amplitude $A_{osc}$ of the oscillating signal s(t) into a reference value $A_{ref}$ for the amplitude. To this end, the loop 34 includes a sensor 36 which measures the amplitude $A_{osc}$. This measurement of the amplitude $A_{osc}$ is then transmitted to a comparator 38 to compare the amplitude measured with the value $A_{ref}$. The comparator 38 is very swift and very precise. For example, the precision of the comparator 38 is within 10 μV. Such a comparator is for example made by means of transistors incorporated into the layers of the magnetoresistive device 6.

This comparator generates a control signal $C_2(t)$ at the terminal 40. This control signal $C_2(t)$ locks the amplitude $A_{osc}$ to the value $A_{ref}$. The signal $C_2(t)$ is set up on the basis of the divergence between the amplitude $A_{osc}$ and the value $A_{ref}$.

The signal $C_2(t)$ is injected into the terminal 18 after it has been amplified by an amplifier 41.

Finally, the oscillator 2 also includes a feedback loop 44 to inject a control signal $C_3(t)$ into the terminal 18 enabling the dampened oscillations of the device 6 to be converted into sustained oscillations even if the intensity of the current $I_d$ is below the threshold $I_c$. To this end, the signal $C_3(t)$ is an amplified periodic signal injected into the terminal 18 in phase with the signal s(t) generated at the same instant on the terminal 10. The term "in phase" designates the fact that the phase shift between the signals $C_3(t)$ and s(t) is equal to zero or practically equal to zero. For example, this phase shift is smaller than π/20 rad. Here, the signal $C_3(t)$ is an amplified copy of the signal s(t) generated by the device 6.

The loop 44 also comprises an amplifier 48. In this embodiment, an input of the amplifier 48 is directly connected to the terminal 10 without going through the amplifier 12 and an output of the amplifier is directly connected to the terminal 18. The gain of this amplifier is determined so as to compensate for the losses of the device 6 and thus obtain a sustained oscillation even if the intensity of the id is lower than the threshold $I_c$. Here, the gain of the amplifier 46 is determined experimentally. To this end, the losses of the device 6 are first of all determined experimentally and then a gain enabling compensation for these losses is fixed for the amplifier 46.

The amplifier 46 has a bandwidth situated around the frequency $f_{osc}$.

In order that the signals s(t) and $C_3(t)$ may be in phase, the loop 44 is as short as possible. For example, its length is smaller than 10 nm and preferably smaller than 1 nm or 100 μm.

To adjust the amplitude and frequency of the signal s(t) generated by the device 6, the oscillator 2 is equipped with a magnetic field generator 50. This generator 50 is placed relatively close to the device 6 so that the lines of the magnetic field that it generates pass through the free layer of the device 6.

For example, this generator 50 takes the form of a conductive track placed in the vicinity of the stack of the layers of the device 6. The shortest distance between this conductive track and the free layer is less than 100 μm to limit the electrical consumption of the generator 50. Advantageously, this distance will be smaller than 10 μm (integrated track) or even smaller than 1 μm. In FIG. 1, the resistivity of this track is represented by a resistance 52. For example, the resistance value 52 is equal to 10Ω and corresponds to the resistance of the conductive track 76, FIG. 2 between the terminal 18 and a reference potential such as the ground.

This generator 50 has a terminal that can be used to make the intensity of the generated magnetic field vary. Here, this terminal constitutes the terminal 18. Indeed, a variation in the intensity of the magnetic field that passes through the free layer enables the amplitude and frequency of the oscillating signal generated by the device 6 to be modified.

Preferably, the terminal 18 is used when the device 6 is weakly tunable in frequency by means of the intensity of the spin-polarized current, or is even very weakly tunable. The terms "weakly tunable" and "very weakly tunable" designate a magnetoresistive device for which the derivative, denoted as $df_{osc}/dI$, of the frequency $f_{osc}$ as a function of the intensity I of the spin-polarized current, is strictly smaller than respectively 1 GHz/mA and 100 MHz/mA on the range of operation of this device. Weakly tunable magnetoresistive devices are generally planar structures that are easy to make. Planar structures are structures in which the magnetic moment of the reference and/or free layers is included in the plane of these layers. Under these conditions, the magnetoresistive device is generally weakly non-linear. The term "weakly non-linear" designates the fact that the derivative $df_{osc}/dA$, of the frequency $f_{osc}$ as a function of the amplitude A of the variations of the resistance of the device 6 is smaller than 10 MHz/Ω on the range of operation.

Preferably, the loop 34 is used only if the device 6 is highly non-linear, i.e. the derivative $df_{osc}/dA$ is greater than 10 MHz/Ω and preferably greater than 100 MHz/Ω on the range of operation of the oscillator. It can be noted that, when a magnetoresistive device is highly non-linear, it is generally also highly tunable so that the generator 50 need not be used for this automatic control.

The loop 34 is typically used to correct fast frequency fluctuations (i.e. fluctuations of a duration smaller than 1 μs) and the loop 16 is used to correct slow fluctuations (i.e. fluctuations of duration greater than 1 μs).

Generally, on the range of operation of the device 6, the variations of the frequency $f_{osc}$ as a function of the intensify I or of the amplitude A are linear or can be approximated by a linear relationship. Thus, the derivatives $df_{osc}/dI$ and $ddf_{osc}/dA$ are considered to be constant here below in this description.

FIG. 2 shows an exemplary embodiment of the magnetoresistive device 6 and of the generator 50.

This magnetoresistive device 6 is shaped according to a geometry known as CPP (current perpendicular to plane) geometry. More specifically, in FIG. 2, the magnetoresistive device adopts a structure known as the "nanopillar" structure. This nanopillar is a pillar formed by stacking horizontal layers of the same horizontal section on top of one another.

Furthermore, the device 6 has a conductive electrode, respectively 60 and 62, at each end of the pillar. These electrodes 60, 62 enable the current that crosses the different layers forming the magnetoresistive device to be conveyed perpendicularly to the plane of these layers. The free ends of these electrodes 60, 62 form, respectively, the terminals 8 and 10 of the device 6.

When the intensity of this current exceeds the intensity of the critical current $I_c$, the voltage between these electrodes 60, 82 starts oscillating at the frequency $f_{osc}$. This frequency $f_{osc}$ depends on the intensity of the current flowing across the electrodes 60, 62. For example, this voltage is transmitted to an electronic apparatus (not shown) which processes it in order to create a reference signal.

Between these electrodes 60 and 62, the pillar has chiefly three layers, namely a reference layer 64, a free layer 66 and a non-magnetic layer 68 interposed between the layers 64 and 86. The non-magnetic layer is better known as a "spacer".

These layers 64, 66 and 68 are laid out and shaped so as to enable the appearance of magnetoresistive properties, i.e. a variation in the resistance of the pillar as a function of the directions of magnetization of the layers 64 and 66.

To improve the readability of FIG. 2, the proportions between the thicknesses of the different layers have not been maintained.

The width L of the different layers that form the pillar is constant. Here, the width L is smaller than 1 μm and typically ranges from 20 nm to 200 nm.

The reference layer 64 is made out of an electrically conductive magnetic material. Its upper face is in direct contact with the spacer 68. It has a direction of easier magnetization contained in the plane of the layer.

The reference layer 64 has the function of spin-polarizing the electrons of the current that crosses it. It therefore has a thickness sufficient to fulfill this function.

For example, the reference layer 64 is made out of cobalt (Co), nickel (Ni), iron (Fe) or their alloys (CoFe, NiFe, CoFeB . . . etc.). The thickness of the reference layer 64 is of the order of some nanometers. The reference layer 64 may be laminated by the insertion of a few (typically 2 to 4) very thin layers of copper, silver or gold with a thickness of the order of 0.2 to 0.5 nm to reduce the spin-diffusion length. It is also possible for the layer 64 to be made of either an SyF (synthetic ferromagnetic) or even an SAF (synthetic antiferromagnetic).

Here, the reference layer 64 has a magnetization of which the direction is fixed. The term "fixed-direction magnetization" designates the fact that it is more difficult to modify the direction of the magnetic moment of the reference layer 64 than it is to modify the magnetic moment of the free layer 66. To obtain this, the magnetization of the reference layer 64 is for example trapped by a conductive antiferromagnetic layer 70 interposed between the reference layer 64 and the electrode 60. The upper face of the layer 70 is for example directly in contact with the lower face of the reference layer 64.

Typically, the thickness of the layer 70 is from 5 to 50 nm. It can be made out of a manganese alloy such as one of the following alloys IrMn, PtMn, FeMn, etc. For example, this layer 70 is made out of a material chosen from the group comprising IrMn, FeMn, PtMn, NiMn.

The spacer 68 is a non-magnetic layer. This spacer 68 is thin enough to enable the spin-polarized current to pass from the reference layer 64 to the free layer 66 in limiting polarization loss. Conversely, the thickness of this spacer 66 is big enough to provide for magnetic decoupling between the layers 64 and 66.

The spacer 68 is made out of an insulating material such as an aluminum oxide or nitride, a magnesium oxide, tantalum nitride, strontium titanate ($SrTiO_3$), etc. The pillar then has tunnel magnetoresistance (TMR) properties and the spacer 68 forms a tunnel barrier. In this case, the thickness of the spacer 88 is typically 0.5 nm to 3 nm Here, the barrier tunnel of the device 6 is thick to show a high RA factor, i.e. a factor greater than 2 or 5 Ωμm².

The RA factor of a tunnel barrier is the product of the resistance of the tunnel barrier multiplied by its area. Here, the area is the surface area of the cross-section of the tunnel barrier.

Generally, the higher the RA factor of the tunnel barrier, the greater will be the range of variation of the resistivity of the tunnel Junction (for example it will be greater than 10%) and the more sensitive will the tunnel junction be to the precession of the magnetization in the free layer.

The free layer 66 is an electrically conductive magnetic layer, the magnetization of which can rotate or "process" more easily than the magnetization of the reference layer 64.

Many embodiments of the free layer are possible. For example, possible embodiments of this free layer are described in the patent application filed under number FR 0 957 888 and in the patent application published under number FR2 892 871.

The lower face of the layer 66 is in direct contact with the upper face of the spacer 68. The upper face for its part is in direct contact with the electrode 62. This layer 66 is for example made out of a ferromagnetic material such as cobalt, nickel or iron or an alloy of these different metals (for example CoFe, CoFeB, NiFe, etc.).

In the absence of spin-polarized current and of any external magnetic field, the direction M of the total magnetic moment of the layer 66 is oriented in parallel to the plane of this layer. The direction M then corresponds to the direction of easier magnetization of the free layer.

Typically, this stack of layers is made on the upper face of a substrate.

In the particular embodiment shown in FIG. 2, the generator 50 is constituted chiefly by a conductive track 76 laid out relatively to the layer 66 so as to create a magnetic field, the field lines of which pass through this layer 66. One example of a field line passing through the layer 66 is shown by the dotted line 78 in FIG. 2. For example, this track 76 is laid out relatively close to the layer 66 so that the magnetic field lines generated are parallel to the direction M of easier magnetization of the layer 66. For example, here, the track 76 extends in a plane parallel to the plane of the free layer 66 and in a direction perpendicular to the direction M. Then, the current passing through the track 76 flows in the appropriate direction so that the magnetic field generated passes through the free layer 66 in the direction M of easier magnetization.

To minimize the intensity of the electrical current in the track 76 which enables the generation of a magnetic field of at least 10 Oe in the free layer 66, this track 76 is attached without any degree of freedom to the layer 66, The unit "Oe" is one Oersted ($\approx 10^{-4}$ Tesla). For example, here, the track 76 is deposited or etched on a layer of dielectric material lying directly on the layer in which the electrode 62 is formed. The track 76 is insulated from the electrode 62 by the thickness of the layer made of dielectric material. Thus, the track 76 is separated from the free layer 66 by a minimum distance that is smaller than 1 µm and preferably smaller than 400 nm.

The use of the magnetic generator 50 to set the frequency or amplitude of the oscillating signal has the following advantages.

For example, when the device 6 is weakly tunable by means of the intensity of the spin-polarized current, this generator makes it possible to reduce the electrical consumption of the oscillator 2 needed to make the loops 16, 34 and/or 44 operate. To illustrate this, the following typical numerical values are used: $df_{osc}/dI=60$ MHz/mA and $df_{osc}/dH=10$ MHz/Oe, where H is the intensity of the magnetic field that passes through the free layer 66. The resistance of the device 6 between the terminals 8 and 10 is taken to be equal to 300 Ω.

With these values, to obtain a variation of 10 MHz in the frequency $f_{osc}$, it is necessary to make the intensity of the polarization current vary by 0.17 mA, which corresponds to a consumed power equal to 8.5 µW ($\approx 300$ Ω*(0.17 mA)$^2$).

To obtain the same variation of frequency $f_{osc}$ in using the generator 50, it is necessary for this generator to generate a variation of 1 Oe in the magnetic field that passes through the free layer 66. Such a variation in the intensity of the magnetic field can be created by means of a 0.3 mA current flowing in the track 76. Thus, the same variation of the frequency $f_{osc}$ in using the generator 50 consumes only 0.9 µW ($\approx 10$Ω*(0.3 mA)$^2$).

Thus, the use of the generator 50 makes it possible to greatly reduce the electrical consumption of the automatic control and/or feedback loops of the oscillator 2. This results from the fact that the in-field tunability of the device 6, represented by the derivative $df_{osc}/dH$, is generally far greater than the tunability in intensity, represented by the derivative $df_{osc}/dI$, of a large number of magnetoresistive devices and especially for weakly tunable devices.

This generator 50 also enables the setting of the frequency or amplitude of the signal s(t) even if the derivative $df_{osc}/dI$ is very low or equal to zero.

The working of the oscillator 2 shall now be described in greater detail with reference to the method of FIG. 3.

Initially, at a step 90, the current source 4 is controlled to generate a direct current $I_d$ whose intensity is strictly below the threshold $I_c$. Thus, the device 6 behaves like a resonator.

In parallel, at a step 92, the amplifier 46 amplifies the part of the signal s(t) picked up at the terminal 18 and, in phase, injects its amplified copy C3(t) into the terminal 10. The loop 44 thus enables compensation for the losses of the device 6 so as to obtain a sustained oscillation even if the intensity of the current Id is strictly below the threshold Ic. Since the intensity of the current Id used is lower, the RA factor of the tunnel barrier of the device 6 can be increased so as to increase the sensitivity of the device 6 and of the oscillator 2. This makes it possible to relax the manufacturing constraints for the device 6.

It has been noted that the quality factor of the oscillator formed solely by the combination of the loop 44 with the device 6 increases as and when the intensity of the current $I_d$ increases. Thus, the quality factor may be set by adjusting the intensity of the current $I_d$. This can be put to use to limit the consumption of the oscillator 2 when a high quality factor is not needed.

At the same time, at a step 94, the loop 34 locks the amplitude $A_{osc}$ of the oscillations of the signal s(t) into the value $A_{ref}$. To this end, at the step 94, the sensor 36 measures the amplitude $A_{osc}$. Then, the comparator 38 compares the amplitude $A_{osc}$ with the value $A_{ref}$ and generates the control signal $C_2(t)$ capable of reducing the divergence between the amplitudes $A_{osc}$ and the value $A_{ref}$. The signal $C_2(t)$ is injected after amplification by the amplifier 41 at the terminal 18.

The amplitude $A_{osc}$ of the oscillations of the signal s(t) is linked by a monotonic function N to the frequency $f_{osc}$. Thus, the locking of the amplitude $A_{osc}$ to the value $A_{ref}$ locks the frequency $f_{osc}$ into a reference frequency corresponding to $N(A_{ref})$.

However, the comparison of the amplitude $A_{osc}$ and the value $A_{ref}$ is done far more quickly than the comparison of the frequencies $f_{osc-r}$ and $f_{ref}$. Indeed, to compare an amplitude with a value, it is not necessary to apply a frequency divider. Thus, the loop 34 reacts far more speedily than the loop 16 and therefore enables compensation for fast fluctuations of the frequency $f_{osc}$ which the loop 16 is not able to compensate for. Since the automatic control loop 34 is far speedier than a frequency locked loop, the quality factor of the oscillator 2 is thereby improved.

Finally, in parallel with the steps 92 and 94, at a step 96, the loop 16 locks the phase of the signal s(t) into the phase of the reference signal $f_{ref}$. To this end, the divider 20 divides the frequency of the signal s(t) to obtain the signal s(t)* with a frequency fosc-r. The signals s(t)* and $f_{ref}$ are then compared by the comparator 24. The comparator 24 then generates a signal C1(t) as a function of the divergence between the phases of the signals s(t)* and $f_{ref}$. This signal C1(t) is built to reduce this divergence. It is applied after having been amplified by the amplifier 28 on the terminal 18.

Thus, the loop 16 makes it possible to keep the signal s(t) in phase with the signal $f_{ref}$.

At a step 98, the different control signals generated during the steps 92 to 94 and 98 get added to each other and are injected into the same control terminal 18. These control signals then make the intensity of the magnetic field vary in proportion to the intensity of the electrical currents generated by the loops 16, 34 and 44. This modification of the intensity of the magnetic field modifies the amplitude and frequency of the signal s(t) generated by the device 6 at the terminal 10. In order that the sensitivity of the device 6 to the variations of intensity of the magnetic field may be high, the gain of the amplifiers 28 and 41 is set so that the intensity of the current injected into the track 76 gives a magnetic field of at least 10 Oe in the free layer. Indeed, below this intensity for the magnetic field, the variations of the frequency $f_{osc}$ are difficult to perceive.

The steps 90 to 98 are repeated in a loop.

Many other embodiments of the oscillator 2 are possible, in particular, the loops 18, 34 and 44 can be used independently of one another. For example, the frequency-locked loop 16 can be omitted.

Each of these loops 16, 34 and 44 can be linked either to the control terminal 18 or to a terminal for controlling the intensity of the frequency $f_{osc}$.

More specifically, when the magnetoresistive device is highly tunable by means of the intensity, i.e. when the derivative $df_{osc}/dI$ is greater than 1 GHz/mA, the automatic control or feedback loops are connected to a terminal for controlling the intensity of the current delivered by the current source. One example of such an embodiment is illustrated in FIG. 4. In the oscillator 100 of FIG. 4, the terminal 18 is replaced by a terminal 102 for controlling the intensity of the current $I_d$. In the oscillator 100, the loop 16 has also been omitted.

The source 4 is replaced by a direct current source 104, the intensity of which is controllable as a function of the signal injected into the terminal 102.

The loops 34 and 44 are connected to this terminal 102 instead of the terminal 108.

In other embodiments, certain loops may be connected to the terminal 18 while other loops are connected to the terminal 102. One example of such an embodiment is illustrated in FIG. 5. FIG. 5 represents an oscillator 110 in which the feedback loop is connected to the terminal 102 for controlling the intensity of the source 104 while the amplitude-locked loop is connected to the terminal 108 for controlling the magnetic field. In this embodiment, the loop 16 is also omitted.

As a variant, it is possible to simultaneously connect one or more of the loops 16, 34 and 44 both to a field control terminal, such as the terminal 18, and to an intensity control terminal, such as the terminal 102. In this case, preferably, an adjustable distributor is introduced to adjust the distribution of the control signal between these two terminals. This distributor is set manually or automatically so as to maximize the sensitivity of the magnetoresistive device to the control signal sent. This makes it possible to adapt to any type of radiofrequency oscillator without having to modify the automatic control or feedback loops.

The amplifier 46 of the feedback loop can also be placed between the terminals 10 and 14 as illustrated in FIG. 6. FIG. 6 represents a radiofrequency oscillator 120, This embodiment reduces the gain of the amplifier 12. Indeed, the amplifier 12 is series-connected with the amplifier 46.

Many other embodiments of the magnetoresistive device 6 are possible. For example, the direction of easier magnetization of the free layer and/or of the reference layer is not necessarily contained in the plane of the layer. For example, the direction of easier magnetization can be perpendicular to the plane of the layer.

Additional layers can be inserted into the stack of layers forming the pillar of the device 6. For example, an antiferromagnetic layer can be inserted between the free layer 66 and the electrode 62.

The reference layer may be a synthetic antiferromagnetic to fix the direction of its magnetization, in this case, the layer 70 can be omitted.

One (or more polarizers) can also be used to make the magnetoresistive device in addition to the reference layer. A polarizer is a magnetic layer or multilayer, the magnetization of which is outside the plane of the layer and, for example, perpendicular to the plane of the layer. The polarizer enables the spin-polarizing of the current that passes through it. Typically, the polarizer is formed by several sub-layers superimposed on one another, for example an alternation of magnetic and metallic layers for example $(Co/Pt)_n$. Here, the polarizer is not described in greater detail. For further information on polarizers, reference may be made to the patent application FR2 817 998. The presence of the polarizer makes it possible to obtain a precession of the magnetization of the free layer outside its plane. This makes it possible for example to make the oscillator work in a zero field, i.e. in the absence of a static external magnetic field. For example, a polarizer is deposited directly beneath the electrode 62.

The cross-sections of the different layers forming the magnetoresistive device are not necessarily all identical. For example, the magnetoresistive device can also be made with a stacking structure known as a "point-contact" structure. Such structures are described in the patent application FR 2 892 871.

The spacer 68 can be made out of an electrically conductive material such as copper (Cu). The magnetoresistive properties of the pillar are then qualified as giant magnetoresistance (GMR) properties. In this case, the thickness of the spacer 68 is typically greater than 2 nm. Generally, its thickness ranges from 2 to 40 nm and is preferably equal to 5 nm to ±25%. Furthermore, typically, the thickness of the reference layer is strictly greater than the spin diffusion length (see for example the patent FR2 892 871 for a definition of this term).

The device 6 can be replaced by an assembly of magnetoresistive devices series-connected or parallel-connected to one another to increase the power of the oscillating signal. In this case, the input and output terminals of these different magnetoresistive devices are connected respectively to common input and output terminals. The amplitude and/or frequency locked loops are connected to these common input and output terminals. Preferably, if a feedback loop is used, it is placed only locally at the terminals of each of the magnetoresistive devices. Thus, in a particular embodiment, each magnetoresistive assembling device comprises its own feedback loop.

The intensity control terminal can be an input terminal of a current summing element, another input terminal of which is connected to the output of a non-controllable direct current source. The output of this summing element, at which the sum of the currents is generated, is directly connected to the input terminal 8 of the device 6.

Other layouts of the conductive track 76 forming the field generator 50 are possible. For example, as a variant, the conductive track 76 extends in parallel to the free layer in the same plane as this layer. The track 76 can also be deposited and/or etched beneath the stack of layers 64, 66 and 68. For example, in this case, the track 76 is deposited and etched on the substrate 74. Furthermore, it is not necessary for the field lines generated by this track 76 to cross the free layer in parallel to its direction of easier magnetization. For example, in a preferred variant, the field lines cross the free layer with a direction perpendicular to the direction of easier magnetization of this free layer.

Magnetic field generators other than a conductive track can also be used.

As a variant, the generator 50, in addition to the magnetic field built from the control signals Ci(t), generates a static magnetic field which adjusts the main oscillation frequency $f_{osc}$.

Since there is a relationship N between the amplitude $A_{osc}$ and the frequency $f_{osc}$, it is possible to set up a frequency locking by directly measuring the amplitude $A_{osc}$. For example, to this end, the measured amplitude is converted by means of the predetermined relationship N into a measured frequency $N(A_{osc})$. Then, the frequency $N(A_{osc})$ is compared with a reference frequency $f_{ref}$. A comparator then generates a control signal as a function of the divergence between these frequencies $N(A_{osc})$ and $f_{ref}$, enabling this divergence to be reduced. This control signal is then injected into the control terminal 18 or 102.

As a variant, the source 4 generates a direct current $I_d$, the intensity of which is greater than or equal to the threshold $I_c$. In this case, the loop 44 can be omitted. However, it can also be kept to improve the quality factor of the oscillator.

In another variant, it is possible to integrate a phase-shifter into the loop 44. This phase-shifter then has the function of keeping the signal $C_3(t)$ injected into the terminal 18 in phase with the signal s(t).

The characteristics of the dependent claims can be implemented independently of the characteristics of the independent claims. For example, the use of the terminal 18 of the generator 50 of the magnetic field to loop the loops 18, 34 or 44 can be implemented independently of the use of an automatic control loop comprising:

a sensor of the amplitude of the oscillations of the oscillating signal, and a comparator capable of generating the control signal as a function of the amplitude measured and the reference value.

The invention claimed is:

1. An apparatus comprising a radiofrequency oscillator, said radiofrequency oscillator comprising a magnetoresistive device within which there flows a spin-polarized electrical current to generate an oscillating signal oscillating at an oscillation frequency on an output terminal, said magnetoresistive device comprising a stack that comprises a reference layer, said reference layer comprising a magnetic layer capable of spin-polarizing an electrical current and having a magnetization along a fixed direction, a free layer, said free layer comprising a magnetic layer having a magnetization that oscillates when said layer is crossed by a spin-polarized current, and a spacer layer, said spacer layer comprising a non-magnetic layer interposed between said free layer and said reference layer to form one of a tunnel junction and a spin valve, a current source for causing flow of electric current along a direction perpendicular to said free layer, said spacer layer, and said reference layer, a control terminal for controlling the frequency of said oscillating signal, and an automatic control loop connected between said output terminal and said control terminal to apply a control signal to said control terminal to automatically lock a characteristic of said oscillating signal into a reference value, said automatic control loop comprising a sensor for sensing an amplitude of oscillations of said oscillating signal, and a comparator for generating said control signal as a function of said amplitude measured and said reference value.

2. The apparatus of claim 1, wherein said comparator is configured to directly compare said measured amplitude with a reference amplitude value so as to automatically control an amplitude of said oscillating signal.

3. The apparatus of claim 1, wherein said oscillator comprises a generator of a magnetic field having field lines that pass through said free layer, said generator comprising a control terminal for controlling at least one characteristic of a generated magnetic field, said at least one characteristic being capable of modifying one of an oscillation frequency and an amplitude of said oscillating signal.

4. The apparatus of claim 3, wherein said magnetic field generator comprises at least one conductive track, said conductive track being one of etched on, deposited on, or beneath a layer of said magnetoresistive device, wherein a current flows through said conductive track, said current having an intensity that determines an intensity of said magnetic field.

5. The apparatus of claim 1, wherein a derivative of oscillation frequency of said oscillating signal generated at said output terminal with respect to amplitude of variations in resistance of said magnetoresistive device is greater 10 MHz/$\Omega$.

6. The apparatus of claim 5, wherein said derivative is greater than 100 MHz/$\Omega$.

7. The apparatus of claim 1, wherein said oscillator further comprises a feedback loop connected between said output terminal and said control terminal, said feedback loop comprising an amplifier configured to generate, as a control signal, an amplified oscillating signal in phase with an oscillating signal generated by said output terminal.

8. A method for generating an oscillating signal at an oscillation frequency, said method comprising providing a radiofrequency oscillator comprising a magnetoresistive device within which there flows a spin-polarized electrical current to generate an oscillating signal oscillating at an oscillation frequency on a output terminal, said magnetoresistive device comprising a stack that comprises a reference layer, said reference layer comprising a magnetic layer capable of spin-polarizing an electrical current and having a magnetization along a fixed direction, a free layer, said free layer comprising a magnetic layer having a magnetization that oscillates when said layer is crossed by a spin-polarized current, and a spacer layer, said spacer layer comprising a non-magnetic layer interposed between said free layer and said reference layer to form one of a tunnel junction and a spin valve, a current source for causing flow of electric current along a direction perpendicular to said free layer, said spacer layer, and said reference layer, a control terminal for controlling the frequency of said oscillating signal, and an automatic control loop connected between said output terminal and said control terminal to apply a control signal to said control terminal to automatically lock a characteristic of said oscillating signal into a reference value, said automatic control loop comprising a sensor for sensing an amplitude of oscillations of said oscillating signal, and a comparator for generating said control signal as a function of said amplitude measured and said reference value, measuring an amplitude of oscillations of said oscillating signal; and generating said control signal as a function of said measured amplitude and said reference value.

* * * * *